United States Patent
Masuoka et al.

(10) Patent No.: US 9,947,670 B2
(45) Date of Patent: *Apr. 17, 2018

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/743,500

(22) Filed: Jun. 18, 2015

(65) Prior Publication Data

US 2016/0071851 A1  Mar. 10, 2016

(30) Foreign Application Priority Data

Sep. 5, 2014 (WO) .................. PCT/JP2014/073560

(51) Int. Cl.
*H01L 27/11* (2006.01)
*H01L 27/02* (2006.01)
(Continued)

(52) U.S. Cl.
CPC ...... *H01L 27/1104* (2013.01); *H01L 27/0207* (2013.01); *H01L 27/0688* (2013.01); *H01L 29/42392* (2013.01)

(58) Field of Classification Search
CPC ......... H01L 27/11568; H01L 27/11578; H01L 27/11582; H01L 29/792; H01L 29/7926;
(Continued)

(56) References Cited

U.S. PATENT DOCUMENTS 5,627,390 A    5/1997 Maeda et al.
5,994,735 A   11/1999 Maeda et al.
(Continued)

FOREIGN PATENT DOCUMENTS

EP    1804286 A1    7/2007
JP    H02-071556 A  3/1990
(Continued)

OTHER PUBLICATIONS

English language translation of International Preliminary Report on Patentability in corresponding International Application No. PCT/JP2014/073560, dated Mar. 7, 2017, 7 pages.

*Primary Examiner* — Fernando L Toledo
*Assistant Examiner* — Lawrence-Linh T Nguyen
(74) *Attorney, Agent, or Firm* — Brinks Gilson & Lione

(57) ABSTRACT

A static random access memory (SRAM) device includes an inverter including a ninth first-conductivity-type semiconductor layer formed on a semiconductor substrate; a first pillar-shaped semiconductor layer which is formed on the semiconductor substrate and in which a first first-conductivity-type semiconductor layer, a first body region, a second first-conductivity-type semiconductor layer, a first second-conductivity-type semiconductor layer, a second body region, and a second second-conductivity-type semiconductor layer are formed from the substrate side in that order; a first gate insulating film formed around the first body region; a first gate formed around the first gate insulating film; a second gate insulating film formed around the second body region; a second gate formed around the second gate insulating film; and a first output terminal connected to the second first-conductivity-type semiconductor layer and the first second-conductivity-type semiconductor layer.

9 Claims, 2 Drawing Sheets

(51) Int. Cl.
*H01L 29/423* (2006.01)
*H01L 27/06* (2006.01)

(58) Field of Classification Search
CPC ............. H01L 27/1104; H01L 27/0207; H01L 29/42392; H01L 27/0688; H01L 27/11; H01L 29/423; H01L 27/02; G11C 16/0483
See application file for complete search history.

(56) References Cited

U.S. PATENT DOCUMENTS

2003/0136978 A1* 7/2003 Takaura .............. H01L 27/0688
257/210
2010/0219483 A1* 9/2010 Masuoka .............. H01L 21/845
257/369

FOREIGN PATENT DOCUMENTS

| JP | H02-188966 A | 7/1990 |
| JP | H03-145761 A | 6/1991 |
| JP | H07-099311 A | 4/1995 |
| JP | H07-321228 A | 12/1995 |
| JP | 2003-224211 A | 8/2003 |
| JP | 2007-525004 A | 8/2007 |
| JP | 2007-250652 A | 9/2007 |
| JP | 2008-172164 A | 7/2008 |
| JP | 2008-300558 A | 12/2008 |
| JP | 2014-057068 A | 3/2014 |

* cited by examiner

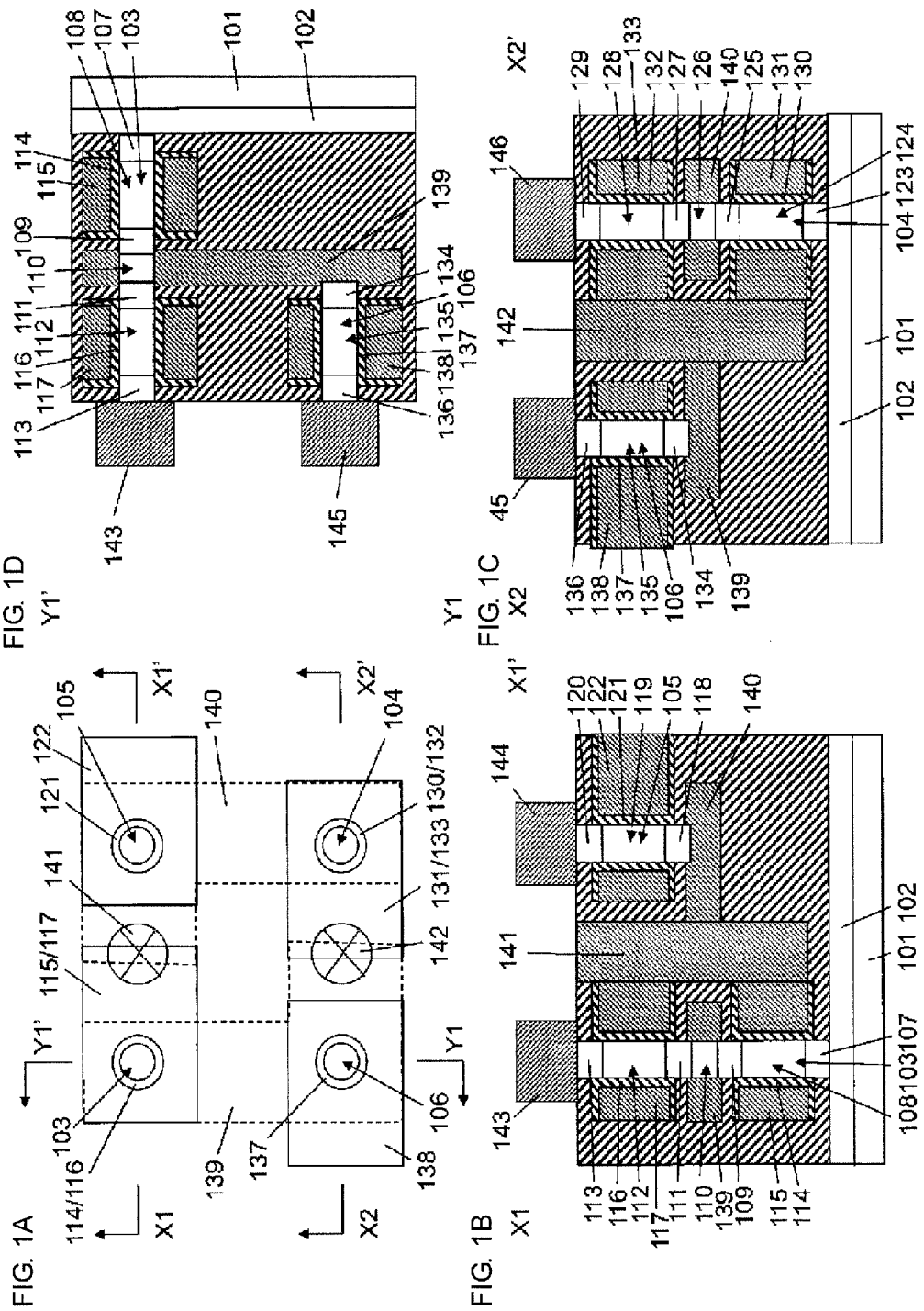

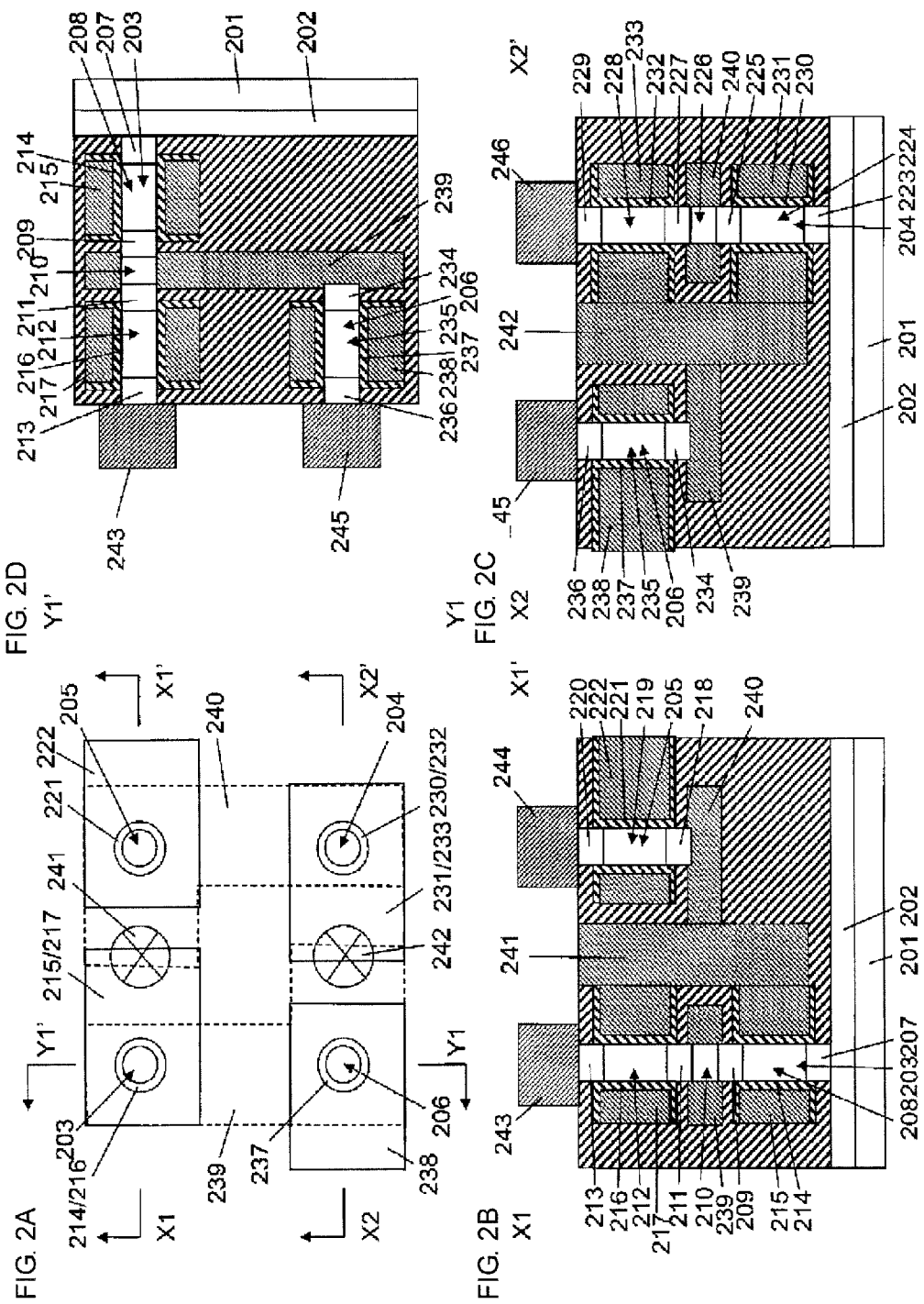

US 9,947,670 B2

SEMICONDUCTOR DEVICE

RELATED APPLICATIONS

The present application claims priority to PCT/JP2014/073560, filed Sep. 5, 2014, the entire contents of which are incorporated herein by reference.

BACKGROUND OF THE INVENTION

1. Field of the Invention

The present invention relates to a semiconductor device.

2. Description of the Related Art

The degree of integration of semiconductor integrated circuits, in particular, integrated circuits that use metal-oxide-semiconductor (MOS) transistors, has been increasing. With the increase in the degree of integration, MOS transistors used in the integrated circuits have been miniaturized to the nanometer scale. With such a miniaturization of MOS transistors, there may be a problem in that it becomes difficult to suppress a leakage current and the area occupied by circuits is not easily decreased from the viewpoint of securing a required amount of current. In order to address this problem, a surrounding gate transistor (hereinafter referred to as an "SGT") has been proposed in which a source, a gate, and a drain are arranged in a direction perpendicular to a substrate and a gate electrode surrounds a pillar-shaped semiconductor layer (refer to, for example, Japanese Unexamined Patent Application Publication Nos. 2-71556, 2-188966, and 3-145761).

In an existing inverter that uses an SGT, one transistor is formed in a single silicon pillar, and an nMOS transistor formed of a single silicon pillar and a pMOS transistor formed of a single silicon pillar are formed on a plane (refer to, for example, Japanese Unexamined Patent Application Publication No. 2008-300558). Since at least two silicon pillars are formed on a plane, an area corresponding to the at least two silicon pillars is necessary.

In an existing non-volatile memory, a plurality of gates are formed around a single silicon pillar (refer to, for example, Japanese Unexamined Patent Application Publication No. 2014-57068). A gate insulating film is formed on a side wall of a silicon pillar, and a source line and a bit line are connected at an upper end and a lower end of the silicon pillar.

SUMMARY OF THE INVENTION

An object of the present invention is to provide a highly-integrated semiconductor device in which an inverter is formed of a single pillar-shaped semiconductor layer.

A semiconductor device according to a first aspect of the present invention includes a ninth first-conductivity-type semiconductor layer formed on a semiconductor substrate; a first pillar-shaped semiconductor layer which is formed on the semiconductor substrate and in which a first first-conductivity-type semiconductor layer, a first body region, a second first-conductivity-type semiconductor layer, a first second-conductivity-type semiconductor layer, a second body region, and a second second-conductivity-type semiconductor layer are formed from the substrate side in that order; a first gate insulating film formed around the first body region; a first gate formed around the first gate insulating film; a second gate insulating film formed around the second body region; a second gate formed around the second gate insulating film; a first output terminal connected to the second first-conductivity-type semiconductor layer and the first second-conductivity-type semiconductor layer; a third pillar-shaped semiconductor layer which is formed above the semiconductor substrate and in which a fifth first-conductivity-type semiconductor layer, a fifth body region, and a sixth first-conductivity-type semiconductor layer are formed from the substrate side in that order; a fifth gate insulating film formed around the fifth body region; a fifth gate formed around the fifth gate insulating film; a second pillar-shaped semiconductor layer which is formed on the semiconductor substrate and in which a third first-conductivity-type semiconductor layer, a third body region, a fourth first-conductivity-type semiconductor layer, a third second-conductivity-type semiconductor layer, a fourth body region, and a fourth second-conductivity-type semiconductor layer are formed from the substrate side in that order; a third gate insulating film formed around the third body region; a third gate formed around the third gate insulating film; a fourth gate insulating film formed around the fourth body region; a fourth gate formed around the fourth gate insulating film; a second output terminal connected to the fourth first-conductivity-type semiconductor layer and the third second-conductivity-type semiconductor layer; a fourth pillar-shaped semiconductor layer which is formed above the semiconductor substrate and in which a seventh first-conductivity-type semiconductor layer, a sixth body region, and an eighth first-conductivity-type semiconductor layer are formed from the substrate side in that order; a sixth gate insulating film formed around the sixth body region; and a sixth gate formed around the sixth gate insulating film. In the semiconductor device, the fifth first-conductivity-type semiconductor layer is connected to the second output terminal, the seventh first-conductivity-type semiconductor layer is connected to the first output terminal, the first gate, the second gate, and the second output terminal are connected to one another, and the third gate, the fourth gate, and the first output terminal are connected to one another.

The semiconductor device according to the first aspect of the present invention may include a first contact that connects the first gate, the second gate, and the second output terminal to one another; and a second contact that connects the third gate, the fourth gate, and the first output terminal to one another.

The semiconductor device according to the first aspect of the present invention may include a first connecting region formed between the second first-conductivity-type semiconductor layer and the first second-conductivity-type semiconductor layer; and a second connecting region formed between the fourth first-conductivity-type semiconductor layer and the third second-conductivity-type semiconductor layer.

The first conductivity type may be an n-type and the second conductivity type may be a p-type.

The first output terminal and the second output terminal may be composed of a metal.

The first output terminal and the second output terminal may be composed of a semiconductor.

The first gate, the second gate, the third gate, the fourth gate, the fifth gate, and the sixth gate may be composed of a metal.

The semiconductor device according to the first aspect of the present invention may include a first power supply line connected to the second second-conductivity-type semiconductor layer; a second power supply line connected to the fourth second-conductivity-type semiconductor layer; a first bit line connected to the sixth first-conductivity-type semiconductor layer; and a second bit line connected to the eighth first-conductivity-type semiconductor layer.

The first pillar-shaped semiconductor layer may be disposed in a first column of a first row, the second pillar-shaped semiconductor layer may be disposed in a second column of a second row, the third pillar-shaped semiconductor layer may be disposed in the second column of the first row, and the fourth pillar-shaped semiconductor layer may be disposed in the first column of the second row.

A semiconductor device according to a second aspect of the present invention includes a fifth second-conductivity-type semiconductor layer formed on a semiconductor substrate; a first pillar-shaped semiconductor layer which is formed on the semiconductor substrate and in which a first second-conductivity-type semiconductor layer, a first body region, a second second-conductivity-type semiconductor layer, a first first-conductivity-type semiconductor layer, a second body region, and a second first-conductivity-type semiconductor layer are formed from the substrate side in that order; a first gate insulating film formed around the first body region; a first gate formed around the first gate insulating film; a second gate insulating film formed around the second body region; a second gate formed around the second gate insulating film; a first output terminal connected to the second second-conductivity-type semiconductor layer and the first first-conductivity-type semiconductor layer; a third pillar-shaped semiconductor layer which is formed above the semiconductor substrate and in which a fifth first-conductivity-type semiconductor layer, a fifth body region, and a sixth first-conductivity-type semiconductor layer are formed from the substrate side in that order; a fifth gate insulating film formed around the fifth body region; a fifth gate formed around the fifth gate insulating film; a second pillar-shaped semiconductor layer which is formed on the semiconductor substrate and in which a third second-conductivity-type semiconductor layer, a third body region, a fourth second-conductivity-type semiconductor layer, a third first-conductivity-type semiconductor layer, a fourth body region, and a fourth first-conductivity-type semiconductor layer are formed from the substrate side in that order; a third gate insulating film formed around the third body region; a third gate formed around the third gate insulating film; a fourth gate insulating film formed around the fourth body region; a fourth gate formed around the fourth gate insulating film; a second output terminal connected to the fourth second-conductivity-type semiconductor layer and the third first-conductivity-type semiconductor layer; a fourth pillar-shaped semiconductor layer which is formed above the semiconductor substrate and in which a seventh first-conductivity-type semiconductor layer, a sixth body region, and an eighth first-conductivity-type semiconductor layer are formed from the substrate side in that order; a sixth gate insulating film formed around the sixth body region; and a sixth gate formed around the sixth gate insulating film. In the semiconductor device, the fifth first-conductivity-type semiconductor layer is connected to the second output terminal, the seventh first-conductivity-type semiconductor layer is connected to the first output terminal, the first gate, the second gate, and the second output terminal are connected to one another, and the third gate, the fourth gate, and the first output terminal are connected to one another.

The semiconductor device according to the second aspect of the present invention may include a first contact that connects the first gate, the second gate, and the second output terminal to one another; and a second contact that connects the third gate, the fourth gate, and the first output terminal to one another.

The semiconductor device according to the second aspect of the present invention may include a first connecting region formed between the second second-conductivity-type semiconductor layer and the first first-conductivity-type semiconductor layer; and a second connecting region formed between the fourth second-conductivity-type semiconductor layer and the third first-conductivity-type semiconductor layer.

The first conductivity type may be an n-type and the second conductivity type may be a p-type.

The first output terminal and the second output terminal may be composed of a metal.

The first output terminal and the second output terminal may be composed of a semiconductor.

The first gate, the second gate, the third gate, the fourth gate, the fifth gate, and the sixth gate may be composed of a metal.

The semiconductor device according to the second aspect of the present invention may include a first ground line connected to the second first-conductivity-type semiconductor layer; a second ground line connected to the fourth first-conductivity-type semiconductor layer; a first bit line connected to the sixth first-conductivity-type semiconductor layer; and a second bit line connected to the eighth first-conductivity-type semiconductor layer.

The first pillar-shaped semiconductor layer may be disposed in a first column of a first row, the second pillar-shaped semiconductor layer may be disposed in a second column of a second row, the third pillar-shaped semiconductor layer may be disposed in the second column of the first row, and the fourth pillar-shaped semiconductor layer may be disposed in the first column of the second row.

According to the aspects of the present invention, a highly-integrated semiconductor device in which an inverter is formed of a single pillar-shaped semiconductor layer can be provided.

A semiconductor device includes a ninth first-conductivity-type semiconductor layer formed on a semiconductor substrate; a first pillar-shaped semiconductor layer which is formed on the semiconductor substrate and in which a first first-conductivity-type semiconductor layer, a first body region, a second first-conductivity-type semiconductor layer, a first second-conductivity-type semiconductor layer, a second body region, and a second second-conductivity-type semiconductor layer are formed from the substrate side in that order; a first gate insulating film formed around the first body region; a first gate formed around the first gate insulating film; a second gate insulating film formed around the second body region; a second gate formed around the second gate insulating film; a first output terminal connected to the second first-conductivity-type semiconductor layer and the first second-conductivity-type semiconductor layer; a third pillar-shaped semiconductor layer which is formed above the semiconductor substrate and in which a fifth first-conductivity-type semiconductor layer, a fifth body region, and a sixth first-conductivity-type semiconductor layer are formed from the substrate side in that order; a fifth gate insulating film formed around the fifth body region; a fifth gate formed around the fifth gate insulating film; a second pillar-shaped semiconductor layer which is formed on the semiconductor substrate and in which a third first-conductivity-type semiconductor layer, a third body region, a fourth first-conductivity-type semiconductor layer, a third second-conductivity-type semiconductor layer, a fourth body region, and a fourth second-conductivity-type semiconductor layer are formed from the substrate side in that order; a third gate insulating film formed around the third body region; a third gate formed around the third gate insulating film; a fourth gate insulating film formed around the fourth body region; a fourth gate formed around the fourth gate insulating film; a second output terminal connected to the fourth first-conductivity-type semiconductor layer and the third second-conductivity-type semiconductor layer; a fourth pillar-shaped semiconductor layer which is formed above the semiconductor substrate and in which a seventh first-conductivity-type semiconductor layer, a sixth body region, and an eighth first-conductivity-type semiconductor layer are formed from the substrate side in that order; a sixth gate insulating film formed around the sixth body region; and a sixth gate formed around the sixth gate insulating film. In the semiconductor device, the fifth first-conductivity-type semiconductor layer is connected to the second output terminal, the seventh first-conductivity-type semiconductor layer is connected to the first output terminal, the first gate, the second gate, and the second output terminal are connected to one another, and the third gate, the fourth gate, and the first output terminal are connected to one another. With this structure, an inverter formed of a single semiconductor pillar is formed. Accordingly, an inverter can be realized on the area corresponding to a single pillar-shaped semiconductor layer, and a highly-integrated static random access memory (SRAM) can be realized using four pillar-shaped semiconductor layers.

In addition, the semiconductor device includes a first connecting region formed between the second first-conductivity-type semiconductor layer and the first second-conductivity-type semiconductor layer, and a second connecting region formed between the fourth first-conductivity-type semiconductor layer and the third second-conductivity-type semiconductor layer. With this structure, the second first-conductivity-type semiconductor layer and the first second-conductivity-type semiconductor layer can be separated from each other, and the fourth first-conductivity-type semiconductor layer and the third second-conductivity-type semiconductor layer can be separated from each other.

A semiconductor device includes a fifth second-conductivity-type semiconductor layer formed on a semiconductor substrate; a first pillar-shaped semiconductor layer which is formed on the semiconductor substrate and in which a first second-conductivity-type semiconductor layer, a first body region, a second second-conductivity-type semiconductor layer, a first first-conductivity-type semiconductor layer, a second body region, and a second first-conductivity-type semiconductor layer are formed from the substrate side in that order; a first gate insulating film formed around the first body region; a first gate formed around the first gate insulating film; a second gate insulating film formed around the second body region; a second gate formed around the second gate insulating film; a first output terminal connected to the second second-conductivity-type semiconductor layer and the first first-conductivity-type semiconductor layer; a third pillar-shaped semiconductor layer which is formed above the semiconductor substrate and in which a fifth first-conductivity-type semiconductor layer, a fifth body region, and a sixth first-conductivity-type semiconductor layer are formed from the substrate side in that order; a fifth gate insulating film formed around the fifth body region; a fifth gate formed around the fifth gate insulating film; a second pillar-shaped semiconductor layer which is formed on the semiconductor substrate and in which a third second-conductivity-type semiconductor layer, a third body region, a fourth second-conductivity-type semiconductor layer, a third first-conductivity-type semiconductor layer, a fourth body region, and a fourth first-conductivity-type semiconductor layer are formed from the substrate side in that order; a third gate insulating film formed around the third body region; a third gate formed around the third gate insulating film; a fourth gate insulating film formed around the fourth body region; a fourth gate formed around the fourth gate insulating film; a second output terminal connected to the fourth second-conductivity-type semiconductor layer and the third first-conductivity-type semiconductor layer; a fourth pillar-shaped semiconductor layer which is formed above the semiconductor substrate and in which a seventh first-conductivity-type semiconductor layer, a sixth body region, and an eighth first-conductivity-type semiconductor layer are formed from the substrate side in that order; a sixth gate insulating film formed around the sixth body region; and a sixth gate formed around the sixth gate insulating film. In the semiconductor device, the fifth first-conductivity-type semiconductor layer is connected to the second output terminal, the seventh first-conductivity-type semiconductor layer is connected to the first output terminal, the first gate, the second gate, and the second output terminal are connected to one another, and the third gate, the fourth gate, and the first output terminal are connected to one another. With this structure, an nMOS selection transistor and an nMOS driver transistor are disposed in the same hierarchy, and thus, the number of lithographic steps can be decreased in the production of the semiconductor device.

BRIEF DESCRIPTION OF THE DRAWINGS

FIG. 1A is a plan view of a semiconductor device according to an embodiment of the present invention.

FIG. 1B is a cross-sectional view taken along line X1-X1' of FIG. 1A.

FIG. 1C is a cross-sectional view taken along line X2-X2' of FIG. 1A.

FIG. 1D is a cross-sectional view taken along line Y1-Y1' of FIG. 1A.

FIG. 2A is a plan view of a semiconductor device according to an embodiment of the present invention.

FIG. 2B is a cross-sectional view taken along line X1-X1' of FIG. 2A.

FIG. 2C is a cross-sectional view taken along line X2-X2' of FIG. 2A.

FIG. 2D is a cross-sectional view taken along line Y1-Y1' of FIG. 2A.

DETAILED DESCRIPTION OF THE PREFERRED EMBODIMENTS

An embodiment of the present invention will now be described. FIGS. 1A to 1D show a structure of a semiconductor device according to an embodiment of the present invention. In the present embodiment, silicon is used as a semiconductor. Alternatively, semiconductors other than silicon may be used.

The semiconductor device includes a ninth first-conductivity-type silicon layer 102 formed on a silicon substrate 101; a first pillar-shaped silicon layer 103 which is formed on the silicon substrate 101 and in which a first first-conductivity-type silicon layer 107, a first body region 108, a second first-conductivity-type silicon layer 109, a first second-conductivity-type silicon layer 111, a second body region 112, and a second second-conductivity-type silicon layer 113 are formed from the substrate side in that order; a first gate insulating film 114 formed around the first body region 108; a first gate 115 formed around the first gate insulating film 114; a second gate insulating film 116 formed around the second body region 112; a second gate 117 formed around the second gate insulating film 116; a first output terminal 139 connected to the second first-conductivity-type silicon layer 109 and the first second-conductivity-type silicon layer 111; a third pillar-shaped silicon layer 105 which is formed above the silicon substrate 101 and in which a fifth first-conductivity-type silicon layer 118, a fifth body region 119, and a sixth first-conductivity-type silicon layer 120 are formed from the substrate side in that order; a fifth gate insulating film 121 formed around the fifth body region 119; a fifth gate 122 formed around the fifth gate insulating film 121; a second pillar-shaped silicon layer 104 which is formed on the silicon substrate 101 and in which a third first-conductivity-type silicon layer 123, a third body region 124, a fourth first-conductivity-type silicon layer 125, a third second-conductivity-type silicon layer 127, a fourth body region 128, and a fourth second-conductivity-type silicon layer 129 are formed from the substrate side in that order; a third gate insulating film 130 formed around the third body region 124; a third gate 131 formed around the third gate insulating film 130; a fourth gate insulating film 132 formed around the fourth body region 128; a fourth gate 133 formed around the fourth gate insulating film 132; a second output terminal 140 connected to the fourth first-conductivity-type silicon layer 125 and the third second-conductivity-type silicon layer 127; a fourth pillar-shaped silicon layer 106 which is formed above the silicon substrate 101 and in which a seventh first-conductivity-type silicon layer 134, a sixth body region 135, and an eighth first-conductivity-type silicon layer 136 are formed from the substrate side in that order; a sixth gate insulating film 137 formed around the sixth body region 135; and a sixth gate 138 formed around the sixth gate insulating film 137. In this semiconductor device, the fifth first-conductivity-type silicon layer 118 is connected to the second output terminal 140. The seventh first-conductivity-type silicon layer 134 is connected to the first output terminal 139. The first gate 115, the second gate 117, and the second output terminal 140 are connected to one another. The third gate 131, the fourth gate 133, and the first output terminal 139 are connected to one another.

The semiconductor device includes a first contact 141 that connects the first gate 115, the second gate 117, and the second output terminal 140 to one another, and a second contact 142 that connects the third gate 131, the fourth gate 133, and the first output terminal 139 to one another.

The semiconductor device includes a first connecting region 110 formed between the second first-conductivity-type silicon layer 109 and the first second-conductivity-type silicon layer 111, and a second connecting region 126 formed between the fourth first-conductivity-type silicon layer 125 and the third second-conductivity-type silicon layer 127. The connecting regions are preferably composed of silicon doped with a low concentration of an impurity or non-doped silicon.

The first conductivity type is preferably an n-type and the second conductivity type is preferably a p-type.

The first output terminal 139 and the second output terminal 140 are preferably composed of a metal.

The first output terminal 139 and the second output terminal 140 may be composed of silicon. When the output terminals are composed of silicon, the output terminals may be subjected to silicidation.

The first gate 115, the second gate 117, the third gate 131, the fourth gate 133, the fifth gate 122, and the sixth gate 138 are preferably composed of a metal in order to adjust the threshold values of the transistors. The metal is preferably titanium nitride or titanium aluminum nitride. Tungsten may also be used. The first gate insulating film 114, the second gate insulating film 116, the third gate insulating film 130, the fourth gate insulating film 132, the fifth gate insulating film 121, and the sixth gate insulating film 137 are each preferably an oxide film, an oxynitride film, or a high-K dielectric film.

The semiconductor device includes a first power supply line 143 connected to the second second-conductivity-type silicon layer 113, a second power supply line 146 connected to the fourth second-conductivity-type silicon layer 129, a first bit line 144 connected to the sixth first-conductivity-type silicon layer 120, and a second bit line 145 connected to the eighth first-conductivity-type silicon layer 136. A ground voltage is applied to the first first-conductivity-type silicon layer 107 and the third first-conductivity-type silicon layer 123 through the ninth first-conductivity-type silicon layer 102.

The first pillar-shaped silicon layer 103 is disposed in a first column of a first row. The second pillar-shaped silicon layer 104 is disposed in a second column of a second row. The third pillar-shaped silicon layer 105 is disposed in the second column of the first row. The fourth pillar-shaped silicon layer 106 is disposed in the first column of the second row. With this arrangement, the pillar-shaped semiconductor layers can be arranged at the vertices of a quadrangle.

Next, another embodiment of the present invention will be described. FIGS. 2A to 2D show a structure of a semiconductor device according to an embodiment of the present invention. In the present embodiment, silicon is used as a semiconductor. Alternatively, semiconductors other than silicon may be used.

The semiconductor device includes a fifth second-conductivity-type silicon layer 202 formed on a silicon substrate 201; a first pillar-shaped silicon layer 203 which is formed on the silicon substrate 201 and in which a first second-conductivity-type silicon layer 207, a first body region 208, a second second-conductivity-type silicon layer 209, a first first-conductivity-type silicon layer 211, a second body region 212, and a second first-conductivity-type silicon layer 213 are formed from the substrate side in that order; a first gate insulating film 214 formed around the first body region 208; a first gate 215 formed around the first gate insulating film 214; a second gate insulating film 216 formed around the second body region 212; a second gate 217 formed around the second gate insulating film 216; a first output terminal 239 connected to the second second-conductivity-type silicon layer 209 and the first first-conductivity-type silicon layer 211; a third pillar-shaped silicon layer 205 which is formed above the silicon substrate 201 and in which a fifth first-conductivity-type silicon layer 218, a fifth body region 219, and a sixth first-conductivity-type silicon layer 220 are formed from the substrate side in that order; a fifth gate insulating film 221 formed around the fifth body region 219; a fifth gate 222 formed around the fifth gate insulating film 221; a second pillar-shaped silicon layer 204 which is formed on the silicon substrate 201 and in which a third second-conductivity-type silicon layer 223, a third body region 224, a fourth second-conductivity-type silicon layer 225, a third first-conductivity-type silicon layer 227, a fourth body region 228, and a fourth first-conductivity-type silicon layer 229 are formed from the substrate side in that order; a third gate insulating film 230 formed around the third body region 224; a third gate 231 formed around the third gate insulating film 230; a fourth gate insulating film 232 formed around the fourth body region 228; a fourth gate 233 formed around the fourth gate insulating film 232; a second output terminal 240 connected to the fourth second-conductivity-type silicon layer 225 and the third first-conductivity-type silicon layer 227; a fourth pillar-shaped silicon layer 206 which is formed above the silicon substrate 201 and in which a seventh first-conductivity-type silicon layer 234, a sixth body region 235, and an eighth first-conductivity-type silicon layer 236 are formed from the substrate side in that order; a sixth gate insulating film 237 formed around the sixth body region 235; and a sixth gate 238 formed around the sixth gate insulating film 237. In this semiconductor device, the fifth first-conductivity-type silicon layer 218 is connected to the second output terminal 240. The seventh first-conductivity-type silicon layer 234 is connected to the first output terminal 239. The first gate 215, the second gate 217, and the second output terminal 240 are connected to one another. The third gate 231, the fourth gate 233, and the first output terminal 239 are connected to one another. An nMOS selection transistor and an nMOS driver transistor are disposed in the same hierarchy, and thus, the number of lithographic steps can be decreased in the production of the semiconductor device.

The semiconductor device includes a first contact 241 that connects the first gate 215, the second gate 217, and the second output terminal 240 to one another, and a second contact 242 that connects the third gate 231, the fourth gate 233, and the first output terminal 239 to one another.

The semiconductor device includes a first connecting region 210 formed between the second second-conductivity-type silicon layer 209 and the first first-conductivity-type silicon layer 211, and a second connecting region 226 formed between the fourth second-conductivity-type silicon layer 225 and the third first-conductivity-type silicon layer 227. The connecting regions are preferably composed of silicon doped with a low concentration of an impurity or non-doped silicon.

The first conductivity type is preferably an n-type and the second conductivity type is preferably a p-type.

The first output terminal 239 and the second output terminal 240 are preferably composed of a metal.

The first output terminal 239 and the second output terminal 240 may be composed of silicon. When the output terminals are composed of silicon, the output terminals may be subjected to silicidation.

The first gate 215, the second gate 217, the third gate 231, the fourth gate 233, the fifth gate 222, and the sixth gate 238 are preferably composed of a metal in order to adjust the threshold values of the transistors. The metal is preferably titanium nitride or titanium aluminum nitride. Tungsten may also be used. The first gate insulating film 214, the second gate insulating film 216, the third gate insulating film 230, the fourth gate insulating film 232, the fifth gate insulating film 221, and the sixth gate insulating film 237 are each preferably an oxide film, an oxynitride film, or a high-K dielectric film.

The semiconductor device includes a first ground line 243 connected to the second first-conductivity-type silicon layer 213, a second ground line 246 connected to the fourth first-conductivity-type silicon layer 229, a first bit line 244 connected to the sixth first-conductivity-type silicon layer 220, and a second bit line 245 connected to the eighth first-conductivity-type silicon layer 236. A power supply voltage is applied to the first second-conductivity-type silicon layer 207 and the third second-conductivity-type silicon layer 223 through the fifth second-conductivity-type silicon layer 202.

The first pillar-shaped silicon layer 203 is disposed in a first column of a first row. The second pillar-shaped silicon layer 204 is disposed in a second column of a second row. The third pillar-shaped silicon layer 205 is disposed in the second column of the first row. The fourth pillar-shaped silicon layer 206 is disposed in the first column of the second row. With this arrangement, the pillar-shaped semiconductor layers can be arranged at the vertices of a quadrangle.

It is to be understood that various embodiments and modifications of the present invention can be made without departing from the broad spirit and the scope of the present invention. The embodiments described above are illustrative examples of the present invention and do not limit the scope of the present invention.

For example, in the above embodiments, a semiconductor device in which the p type (including the $p^+$ type) and the n type (including the $n^+$ type) are each changed to the opposite conductivity type is also covered by the technical scope of the present invention.

What is claimed is:

1. A semiconductor device comprising:
   a first-conductivity-type semiconductor layer on a semiconductor substrate;
   a first pillar-shaped semiconductor layer on the semiconductor substrate and including sequentially from the substrate, a first first-conductivity-type semiconductor layer in contact with the substrate, a first body region, a second first-conductivity-type semiconductor layer, the first pillar-shaped semiconductor layer further including sequentially above the second first-conductivity-type semiconductor layer, a first second-conductivity-type semiconductor layer, a second body region, and a second second-conductivity-type semiconductor layer;
   a first gate insulating film around the first body region;
   a first gate around the first gate insulating film;
   a second gate insulating film around the second body region;
   a second gate around the second gate insulating film;
   a first output terminal connected to the second first-conductivity-type semiconductor layer and the first second-conductivity-type semiconductor layer;
   a second pillar-shaped semiconductor layer on the semiconductor substrate and including sequentially from the substrate, a third first-conductivity-type semiconductor layer in contact with the substrate, a third body region, a fourth first-conductivity-type semiconductor layer, the second pillar-shaped semiconductor layer further including sequentially above the fourth first-conductivity-type semiconductor layer, a third second-conductivity-type semiconductor layer, a fourth body region, and a fourth second-conductivity-type semiconductor layer;
   a third gate insulating film around the third body region;
   a third gate around the third gate insulating film;
   a fourth gate insulating film around the fourth body region;
   a fourth gate around the fourth gate insulating film;
   a second output terminal connected to the fourth first-conductivity-type semiconductor layer and the third second-conductivity-type semiconductor layer;
   a third pillar-shaped semiconductor layer on the first output terminal and including sequentially from the first output terminal, a fifth first-conductivity-type semiconductor layer, a fifth body region, and a sixth first-conductivity-type semiconductor layer;
   a fifth gate insulating film around the fifth body region;
   a fifth gate around the fifth gate insulating film;
   a fourth pillar-shaped semiconductor layer on the second output terminal and including sequentially from the second output terminal, a seventh first-conductivitytype semiconductor layer, a sixth body region, and an eighth first-conductivity-type semiconductor layer;
a sixth gate insulating film around the sixth body region; and
a sixth gate around the sixth gate insulating film,
wherein the fifth first-conductivity-type semiconductor layer is connected to the second output terminal,
the seventh first-conductivity-type semiconductor layer is connected to the first output terminal,
the first gate, the second gate, and the second output terminal are connected to one another, and
the third gate, the fourth gate, and the first output terminal are connected to one another.

2. The semiconductor device according to claim 1, further comprising:
a first contact that connects the first gate, the second gate, and the second output terminal to one another; and
a second contact that connects the third gate, the fourth gate, and the first output terminal to one another.

3. The semiconductor device according to claim 1, further comprising:
a first connecting region between the second first-conductivity-type semiconductor layer and the first second-conductivity-type semiconductor layer; and
a second connecting region between the fourth first-conductivity-type semiconductor layer and the third second-conductivity-type semiconductor layer.

4. The semiconductor device according to claim 1, wherein the first conductivity type is an n-type and the second conductivity type is a p-type.

5. The semiconductor device according to claim 1, wherein the first output terminal and the second output terminal are composed of a metal.

6. The semiconductor device according to claim 1, wherein the first output terminal and the second output terminal are composed of a semiconductor.

7. The semiconductor device according to claim 1, wherein the first gate, the second gate, the third gate, the fourth gate, the fifth gate, and the sixth gate are composed of a metal.

8. The semiconductor device according to claim 1, further comprising:
a first power supply line connected to the second second-conductivity-type semiconductor layer;
a second power supply line connected to the fourth second-conductivity-type semiconductor layer;
a first bit line connected to the sixth first-conductivity-type semiconductor layer; and
a second bit line connected to the eighth first-conductivity-type semiconductor layer.

9. The semiconductor device according to claim 1, wherein the first pillar-shaped semiconductor layer is disposed in a first column of a first row, the second pillar-shaped semiconductor layer is disposed in a second column of a second row, the third pillar-shaped semiconductor layer is disposed in the second column of the first row, and the fourth pillar-shaped semiconductor layer is disposed in the first column of the second row.

* * * * *